United States Patent
Inoue et al.

(10) Patent No.: US 9,477,123 B2
(45) Date of Patent: Oct. 25, 2016

(54) LIQUID CRYSTAL DISPLAY DEVICE AND PRODUCTION METHOD THEREOF

(71) Applicant: Japan Display Inc., Tokyo (JP)

(72) Inventors: Kouichi Inoue, Tokyo (JP); Tomokazu Saitou, Tokyo (JP)

(73) Assignee: Japan Display Inc., Tokyo (JP)

( * ) Notice: Subject to any disclaimer, the term of this patent is extended or adjusted under 35 U.S.C. 154(b) by 77 days.

(21) Appl. No.: 14/070,413

(22) Filed: Nov. 1, 2013

(65) Prior Publication Data

US 2014/0132895 A1    May 15, 2014

(30) Foreign Application Priority Data

Nov. 9, 2012    (JP) ................................. 2012-247021

(51) Int. Cl.
*G02F 1/1345* (2006.01)
*H05K 3/32* (2006.01)
*H05K 3/36* (2006.01)
*G02F 1/13* (2006.01)

(52) U.S. Cl.
CPC ......... *G02F 1/13452* (2013.01); *G02F 1/1303* (2013.01); *G02F 1/13458* (2013.01); *H05K 3/323* (2013.01); *H05K 3/361* (2013.01); *H05K 2201/10128* (2013.01); *Y10T 29/49155* (2015.01)

(58) Field of Classification Search
CPC .......... G02F 1/13452; G02F 1/13458; H05K 3/361; H05K 3/323; Y10T 29/49155; H01L 2224/83851; H01L 2224/838
USPC .......................................................... 349/96
See application file for complete search history.

(56) References Cited

U.S. PATENT DOCUMENTS

| 5,726,726 A * | 3/1998 | Nakanishi ..................... 349/149 |
| 5,847,796 A * | 12/1998 | Uchiyama et al. ........... 349/151 |
| 7,206,056 B2 * | 4/2007 | Morishita et al. ............ 349/152 |
| 2002/0105263 A1 * | 8/2002 | Kim .............................. 313/498 |
| 2003/0090607 A1 * | 5/2003 | Kamijo ........................... 349/96 |

(Continued)

FOREIGN PATENT DOCUMENTS

| CN | 1841139 A | 10/2006 |
| JP | 2001-52778 A | 2/2001 |
| JP | 2011-14791 A | 1/2011 |

OTHER PUBLICATIONS

Liu, Zhiling; Chinese Office Action issued in Chinese Patent Application No. 2013105479253; issued on Jul. 7, 2016; 26 pages including English translation.

*Primary Examiner* — Paul Lee
*Assistant Examiner* — Jia Pan
(74) *Attorney, Agent, or Firm* — Ulmer & Berne LLP (57) ABSTRACT

This disclosure aims to reduce workloads and material costs when a driving circuit and a flexible wiring board are fixed to a first substrate. A display device includes a display panel having the first substrate. The driving circuit is fixed to the first substrate in a portion other than a display portion with an anisotropic conductive film. The flexible wiring board is fixed to the first substrate at an end of the portion other than the display portion with an anisotropic conductive film. The anisotropic conductive film for fixing the driving circuit and the anisotropic conductive film for fixing the flexible wiring board are the same. The anisotropic conductive film is also formed and hardened in a region other than a region having the driving circuit and the flexible wiring board fixed therein within the portion other than the display portion of the first substrate.

11 Claims, 5 Drawing Sheets

(56) References Cited

U.S. PATENT DOCUMENTS

| | | |
|---|---|---|
| 2003/0102424 A1* | 6/2003 | Izumi et al. ............... 250/208.1 |
| 2005/0162603 A1* | 7/2005 | Cheng ................. G02F 1/13452 349/149 |
| 2006/0126002 A1* | 6/2006 | Morishita et al. ............ 349/187 |
| 2006/0181218 A1* | 8/2006 | Jung et al. .................... 313/631 |
| 2006/0238450 A1 | 10/2006 | Onodera |
| 2007/0046336 A1* | 3/2007 | Kang et al. ................... 326/101 |
| 2007/0052903 A1* | 3/2007 | Kang ........................ C09J 7/02 349/149 |
| 2008/0079889 A1* | 4/2008 | Lee et al. ...................... 349/151 |

* cited by examiner

LIQUID CRYSTAL DISPLAY DEVICE AND PRODUCTION METHOD THEREOF

CLAIM OF PRIORITY

The present application claims priority from Japanese patent application JP2012-247021 tiled on Nov. 9, 2012, the content of which is hereby incorporated by reference into this application.

BACKGROUND

The present invention relates to a display device and a production method thereof and in particular to a method for fixing an IC driver and a flexible wiring board.

Figure 2:
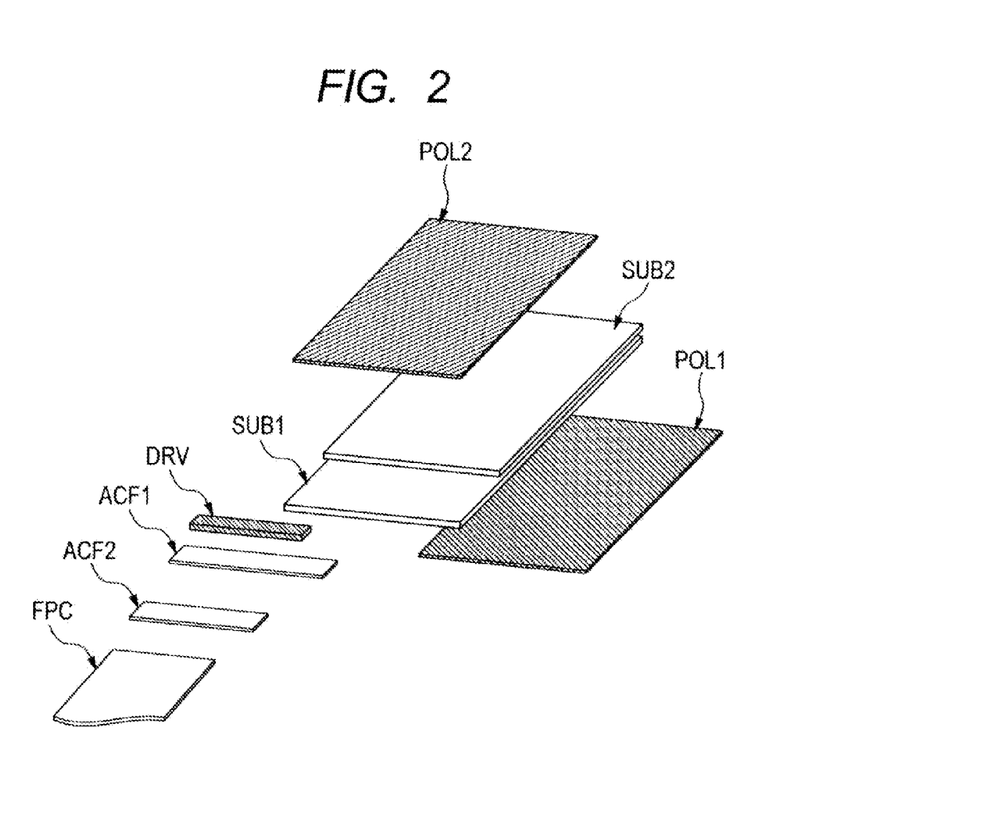
FIG. 2 is an exploded perspective view of a conventional liquid crystal display panel.
Figure 3:
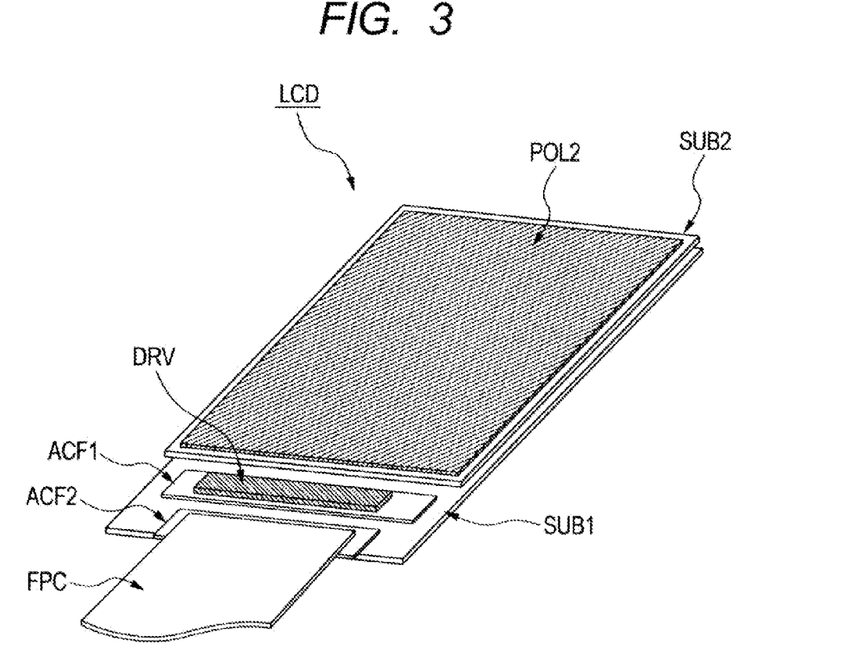
FIG. 3 is a perspective View showing a schematic structure of the conventional, liquid crystal display panel.

FIG. 2 is an exploded perspective view of a conventional liquid crystal display panel and FIG. 3 is a perspective view of the conventional liquid crystal display panel.

As shown in FIGS. 2 and 3, the conventional liquid crystal display panel (LCD) includes the first substrate (SUB1), the second substrate (SUB2), and a liquid crystal layer (not shown) arranged and sealed between the first substrate (SUB1) and the second substrate (SUB2).

Onto surfaces of the liquid crystal display panel (LCD), an upper polarizing plate (POL2) and a lower polarizing plate (POL1) are attached, respectively. Moreover, an IC driver (hereinafter, referred to as driving circuit; DRV) is fixed to the first substrate (SUB1) with an anisotropic conductive film (ACF1) for driving circuit in a portion of the first substrate (SUB1) other than a display portion (i.e., a portion of the first substrate (SUB1) which is uncovered, by the second substrate (SUB2)). Also, a flexible wiring board (FPC) is fixed to the first substrate (SUB1) with an anisotropic conductive film (ACF2) for flexible wiring board at an end of the portion other than the display portion.

Although a backlight unit is arranged on the lower polarizing plate (POL1) side of the liquid crystal display panel (LCD), it is not shown in FIGS. 2 and 3.

An anisotropic conductive adhesive film for bonding and fixing an electronic component such as an IC chip and a circuit board to each other and for electrically connecting electrodes thereof to each other, is disclosed in JP-A No. 52778/2001. Moreover, a bonding device for bonding an anisotropic conductive film to a substrate of a liquid crystal display panel or the like is disclosed in JP-A No. 14791/2011.

SUMMARY

In conventional liquid crystal display panel (LCD), exclusive anisotropic conductive film (ACF1 and ACF2) are used as the anisotropic conductive film for driving circuit and that for flexible wiring board, respectively, to fix the driving circuit (DRV) to the portion of the first substrate (SUB1) other than the display portion and the flexible wiring board (FPC) to the first substrate (SUB1) at the end of the portion other than the display portion.

As described above, in the process for fixing the driving circuit and the flexible wiring board to the first substrate (SUB1) in the conventional liquid crystal display panel (LCD), a number of types of anisotropic conductive films are used and the conditions, of use (e.g., a pressure-bonding temperature and a pressure-bonding time) are different from one another. Therefore, there is a problem that it takes long to change the type and replace and replenish members, for example, and therefore the workloads are heavy.

The present invention is made for solving the problem of the related art. It is therefore an object of the present invention to provide a technique which can reduce the workloads and the material costs when the driving circuit, and the flexible wiring board are fixed to the first substrate.

The above and other objects and novel features of the present invention are made apparent by the description of this specification and the accompanying drawings.

The brief summary of a typical aspect of the invention disclosed in the present application is as follows.

(1) A display device is provided which includes a display panel having the first substrate. The first substrate has a driving circuit fixed to the first substrate in a portion other than a display portion with an anisotropic conductive film and also has a flexible wiring board fixed to the first substrate at an end of the portion other than the display portion with an anisotropic conductive film. The anisotropic conductive film for fixing the driving circuit to the first substrate in the portion other than the display portion and the anisotropic conductive film for fixing the flexible wiring board to the first substrate at the end of the portion other than the display portion are the same one. That anisotropic conductive film is also formed and hardened in a region other than a region having the driving circuit and the flexible wiring board fixed therein within the portion of the first substrate other than the display portion.

(2) In (1), the display panel has the second substrate arranged to be opposed to the first substrate. The portion of the first substrate other than the display portion is uncovered by the second substrate.

(3) A production method of a display device including a display panel having the first substrate is provided. The first substrate has a driving circuit fixed to the first substrate in a portion other than a display portion with an anisotropic conductive film and also has a flexible wiring board fixed to the first substrate at an end of the portion other than the display portion with an anisotropic conductive film. The production method includes: the step 1 of arranging the anisotropic conductive film in a whole area of the first substrate except for the display portion; the step 2 of arranging the driving circuit on the anisotropic conductive film applying a pressure and performing heating to fix the driving circuit to the first substrate in the portion other than the display portion with the anisotropic conductive film; and the step 3 of arranging the flexible wiring board on the anisotropic conductive film, applying a pressure and performing heating to fix the flexible wiring board to the first substrate in the portion other than the display portion with the anisotropic conductive film. The first head having a groove to which the driving circuit is inserted on its contact surface is used for pressing and heating the driving circuit and a region around the driving circuit in the step 2, while the second head having a groove to which the flexible wiring board is inserted on its contact surface is used for pressing and heating the flexible wiring board and a region around the flexible wiring board in the step 3. In this manner, the anisotropic conductive film in a region other than a region having the driving circuit and the flexible wiring board fixed therein within the portion other than the display portion of the first substrate is hardened.

The advantageous effects obtained by a typical one of the inventions disclosed in the present application are briefly described below.

According to the display device, of the present invention, it is possible to reduce the workloads and the material costs in fixing the driving circuit and the flexible wiring board to the first substrate.

These features and advantages of the invention will be apparent from the following more particular description of preferred embodiments of the invention, as illustrated in the accompanying drawings.

BRIEF DESCRIPTION OF THE DRAWINGS

FIGS. 1A, 1B, IC, and 1D are diagrams illustrating a method for fixing a driving circuit and a flexible wiring board of a liquid crystal display panel according to an embodiment of the present invention;

DETAILED DESCRIPTION OF THE PREFERRED EMBODIMENTS

Preferred embodiments of the present invention are now described in detail, referring to the drawings.

Components having the same functions are labeled with the same reference signs throughout the drawings for explaining the embodiments, and the repeating description thereof is omitted. Please note that the following embodiments are not intended to limit the interpretation of the claims of the present invention.

The structure of the liquid crystal display panel according to an embodiment of the present invention is the same as that of the conventional liquid crystal display panel shown in FIGS. 2 and 3, and therefore the repeating description thereof is omitted.

In the conventional crystal display panel (LCD), the driving circuit (DRV) is fixed to the first substrate (SUB1) with the anisotropic conductive film (ACF1) for driving circuit in the portion other than the display portion (i.e., the portion of the first substrate (SUB1) which is uncovered by the second substrate (SUB2)). Also, the flexible wiring board (FPC) is fixed to the first substrate (SUB1) with the anisotropic conductive film (ACF2) for flexible wiring board at the end of the portion other than the display portion. On the other hand, in the liquid crystal display panel (LCD) of this embodiment, with the same anisotropic conductive film (ACF), the driving circuit (DRV) is fixed to the first substrate (SUB1) in the portion other than the display portion (i.e., the portion of the first substrate (SUB1) which is uncovered by the second substrate (SUB2)) and the flexible wiring board (FPC) is fixed to the first substrate (SUB1) at the end of the portion other than the display portion.

[The method for Fixing the Driving Circuit and the Flexible Wiring Board in the Conventional Liquid Crystal Display Panel]

Before describing the fixing method of the driving circuit (DRV) and the flexible wiring board (FPC) in the liquid crystal display panel (LCD) of the present embodiment, the method for fixing the driving circuit (DRV) and the flexible wiring board (FPC) in the conventional liquid crystal display panel (LCD) is described.

FIGS. 4A to 4F are diagrams explaining the method for fixing the driving circuit (DRV) and the flexible wiring board in the conventional liquid crystal display panel (LCD).

Figure 4:
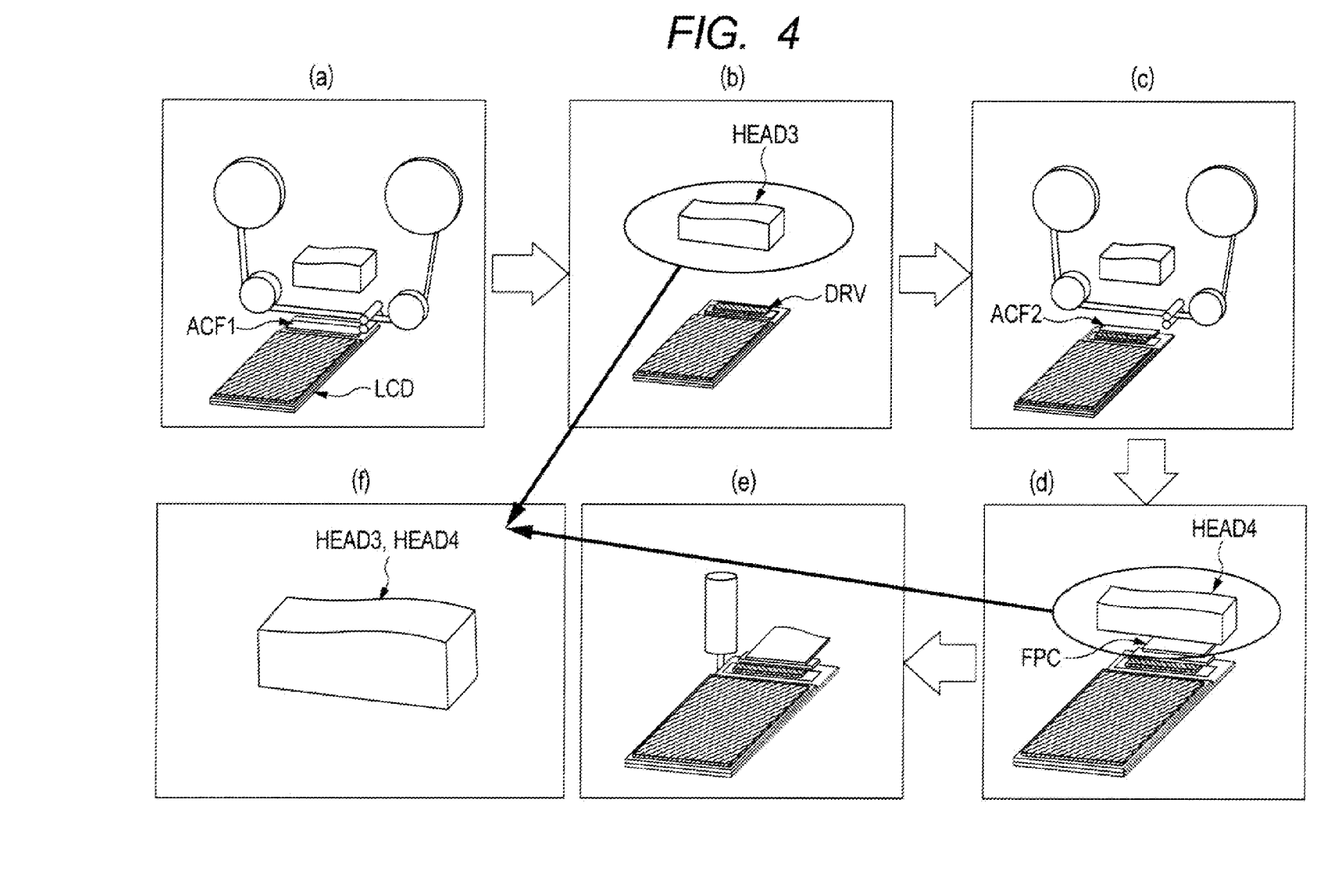
FIGS. 4A, 4B, 4C, 4D, 4E, and 4F are diagrams illustrating a method for fixing a driving circuit and a flexible wiring board of the conventional liquid crystal display panel.

First, the anisotropic conductive film (ACF1) for driving circuit is arranged in the portion other than the display portion of the first substrate (SUB1) in the conventional liquid crystal display panel, as shown in FIG. 4A.

Then, the driving circuit (DRV) is arranged on the anisotropic conductive film (ACF1) for driving circuit as shown in FIG. 4B is pressed by a pressure applied by means of a flat head 1 (HED3) having a flat contact surface as shown in FIG. 4F, and is heated. In this manner, the driving circuit (DRV) is fixed to the portion other than the display portion of the first substrate (SUB1).

Subsequently, the anisotropic conductive film (ACF2) for flexible wiring board is arranged at the end of the portion other than the display portion in the first substrate (SUB1), as shown in FIG. 4C.

The flexible wiring board (FPC) is then arranged on the anisotropic conductive film (ACF2) for flexible wiring board as shown in FIG. 4D, is pressed by a pressure applied by means of a flat head 2 (HED4) having a flat contact surface as shown in FIG. 4F, and is heated. In this manner, the flexible wiring board (FPC) is fixed to the end of the portion other than the display portion of the first substrate (SUB1).

Then, as shown in FIG. 4E, resin such as epoxy or silicone is applied to the first substrate (SUB1) in a region within the portion other than the display portion, other than a region having the driving circuit (DRV) and the flexible wiring board (FPC) fixed therein, for protecting a QD inspection pad and a wiring surface.

Figure 5:
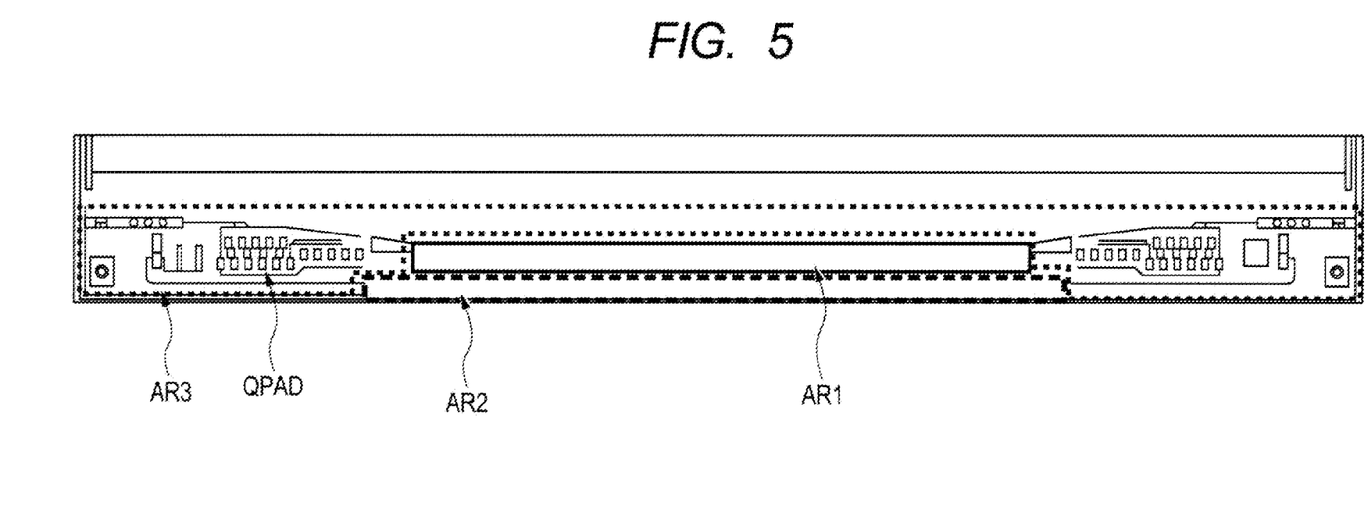
FIG. 5 is a diagram showing positions at which anisotropic conductive films are attached in the conventional liquid crystal display panel.

FIG. 5 shows the position where the anisotropic conductive film is attached and the position where the resin is applied in the conventional liquid crystal display panel. In FIG. 5, QPAD denotes the QD inspection pad.

A region (AR1) shown with solid line in FIG. 5 is a region where the driving circuit (DRV) is fixed, while a region (AR2) shown with bold broken line is a region where the flexible wiring board (FPC) is fixed. Further, a region (AR3) shown with fine broken line is a region where the resin such as epoxy or silicone is applied.

In this manner, in the conventional liquid crystal display panel (LCD) the anisotropic conductive film (ACF1) for driving circuit and the anisotropic conductive film (ACF2) for flexible wiring board are used to fix the driving circuit (DRV) to the first substrate (SUB1) in the portion other than the display portion and the flexible wiring board (FPC) to the first substrate (SUB1) at the end of the portion other than the display portion.

The anisotropic conductive film (ACF1) for driving circuit and the anisotropic conductive film (ACF2) for flexible wiring board are different from each other in the conditions of use (e.g., a pressure bonding temperature and a pressure bonding time). Therefore, there is a problem that, in the process for fixing the driving circuit and the flexible wiring board in the conventional liquid crystal display panel (LCD), it takes long to change the types, and replace and replenish members, for example, and therefore the workloads are heavy.

Moreover, the resin such as epoxy or silicone is applied in the region within the portion other than the display portion of the first substrate (SUB1), other than a region having the driving circuit (DRV) and the flexible wiring board (FPC) fixed therein, for protecting the QD inspection pad and the wiring surface, as shown in FIG. 4E. This further increases the workloads.

[Method for Fixing the Driving Circuit and the Flexible Wiring Board in the Liquid Crystal Display Panel According to the Present Embodiment]

In the present embodiment, an anisotropic conductive film (ACF) for driving circuit and flexible wiring board is attached into the whole area on the first substrate (SUB1) except for the display portion at once, thereby reducing the workloads and the material costs in the process for fixing the driving circuit (DRV) and the flexible wiring board (FPC) in the liquid crystal display panel (LCD) and also eliminating the resin application process.

FIGS. 1A to 1D are diagrams explaining the method for fixing the driving circuit (DRV) and the flexible wiring board of the liquid crystal display panel (LCD) according to the present embodiment.

Figure 1:
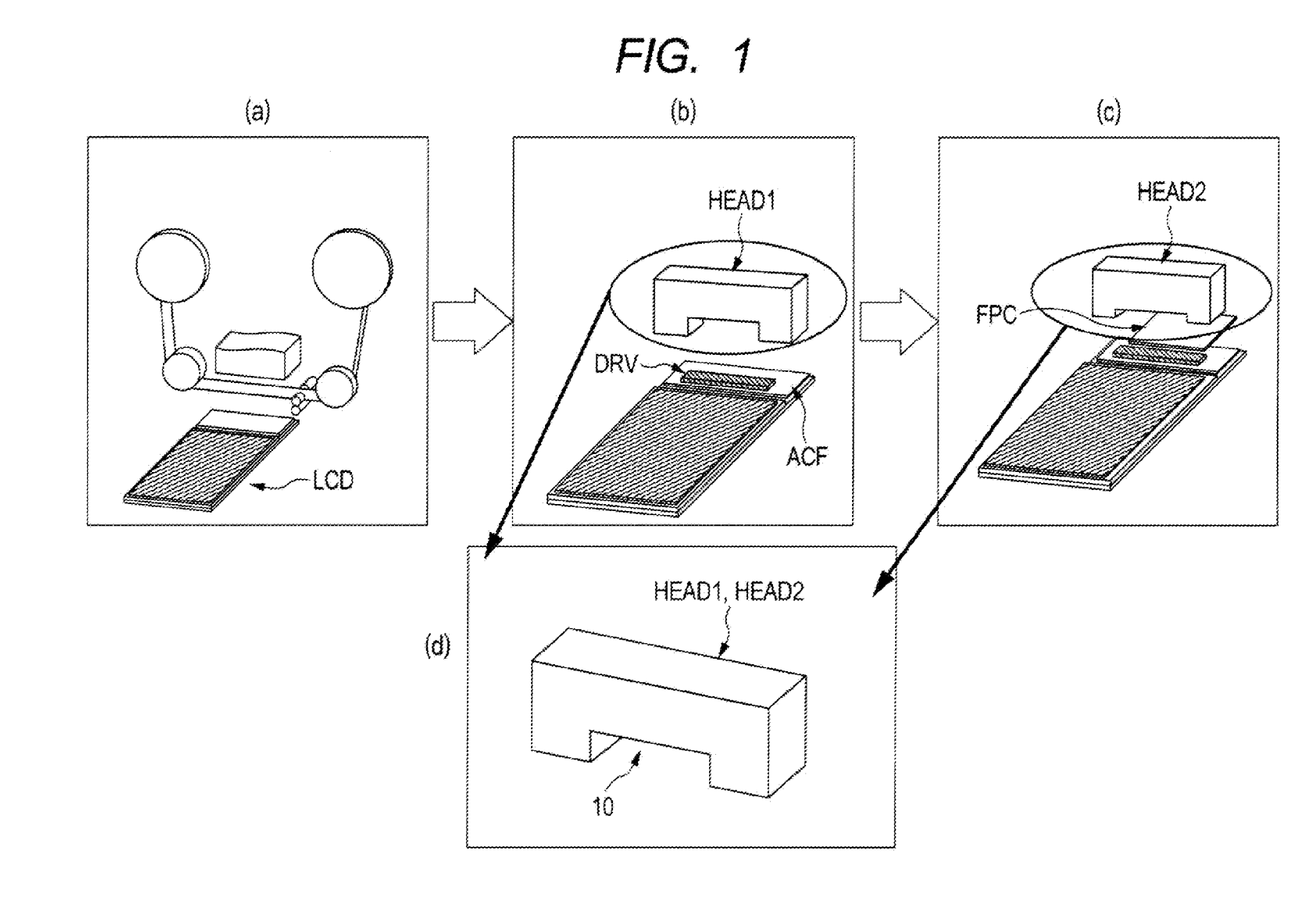

In the liquid crystal display panel of the present embodiment, first, the anisotropic conductive film (ACF) for driving circuit and flexible wiring board is arranged in the whole area of the first substrate (SUB1) except for the display portion, as shown in FIG. 1A.

Then, the driving circuit (DRV) is arranged on the anisotropic conductive film (ACF) for driving circuit and flexible wiring board, as shown in FIG. 1B. The thus arranged driving circuit (DRV) is pressed by a pressure applied by means of a grooved head 1 (HED1) having a groove 10 to which the driving circuit (DRV) is inserted in its contact surface, as shown in FIG. 1D, and is heated. Thus, the driving circuit (DRV) is fixed to the first substrate (SUB2) in a portion other than the display portion.

Subsequently, the flexible wiring board (FPC) is arranged on the anisotropic conductive film (ACF) for driving circuit and flexible wiring board, as shown in FIG. 1C. The thus arranged flexible wiring board (FPC) is pressed by a pressure applied by means of a grooved head 2 (HED2) having a groove 10 in its contact surface, to which the flexible wiring board (FPC) is inserted, as shown in FIG. 1D, and is heated. In this manner, the flexible wiring board (FPC) is fixed to the first substrate (SUB1) at an end of the portion other than the display portion.

By fixing the driving circuit (DRV) to the first substrate (SUB1) in the portion other than the display portion with the anisotropic conductive film (ACF) for driving circuit and flexible wiring board, a bump electrode of the driving circuit (DRV) is electrically and mechanically connected to a terminal formed in the portion other than the display portion of the first substrate (SUB1).

Similarly, by fixing the flexible wiring board (FPC) to the first substrate (SUB1) at the end of the portion other than the display portion with the anisotropic conductive film (ACF) for driving circuit and flexible wiring board, a connection terminal of the flexible wiring board (FPC) electrically and mechanically connected to a terminal formed at the end of the portion of the first substrate (SUB1) other than the display portion.

In this embodiment, when the driving circuit (DRV) is fixed to the first substrate (SUB1) in the portion other than the display portion as shown in FIG. 1B, the anisotropic conductive film (ACF) for driving circuit and flexible wiring board around the driving circuit (DRV) is pressed by the grooved head 1 (HED1) and is heated. Also, when the flexible wiring board (FPC) fixed to the end of the portion of the first substrate (SUB1) other than the display portion as shown in FIG. 1C the anisotropic conductive film (ACF) for driving circuit and flexible wiring board around the flexible wiring board (FPC) is pressed by the ground head 2 (HED2) and is heated.

Therefore, in this embodiment, the anisotropic conductive film (ACF) for driving circuit and flexible wiring board in a region other than a region where the driving circuit (DRV) and the flexible wiring board (FPC) are fixed is also hardened.

Thus, this embodiment does not need the process for applying the resin such as epoxy or silicone onto the region other than the region having the driving circuit (DRV) and the flexible wiring board (FPC) fixed therein within the portion other than the display portion of the first substrate (SUB1) in order to protect a QD inspection pad (QPAD) and a wiring surface in the conventional liquid crystal display panel.

As described above, according to the present embodiment, the anisotropic conductive film (ACF) for driving circuit and flexible wiring board is attached into the whole area of the first substrate (SUB1) except for the display portion at once. Thus, it is possible to reduce the workloads and the material costs in the process for fixing the driving circuit (DRV) and the flexible wiring board (FPC) in the liquid crystal display panel.

In the foregoing description the embodiment is described in which the present invention is applied to a crystal display device. However, the present invention is not limited thereto. The present invention be also applied to a display device such as an organic EL display device.

The invention made by the inventor of the present application is specifically described above based on the aforementioned embodiment. However, the present invention is not limited to that embodiment, but can be modified in various ways without departing from the summary thereof.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. A display device comprising a display panel having a first substrate,
wherein the first substrate includes a driving circuit fixed to the first substrate in a portion other than a display portion with an anisotropic conductive film, and a flexible wiring board fixed to the first substrate at an end of the portion other than the display portion with a further anisotropic conductive film,
the anisotropic conductive film for fixing the driving circuit to the first substrate in the portion other than the display portion and the further anisotropic conductive film for fixing the flexible wiring board to the first substrate at the end of the portion other than the display portion are the same one,
the portion other than the display portion of the first substrate has a first region where the driving circuit and the flexible wiring board are disposed, and a second region where a QD inspection pad is formed,
the anisotropic conductive film is formed on a whole area of the first substrate except for the display portion,
the anisotropic conductive film is also formed and hardened in the second region within the portion other than the display portion of the first substrate, other than the first region having the driving circuit and the flexible wiring board fixed therein, the anisotropic conductive film is formed on the first region and the second region integrally, and the anisotropic conductive film which is formed on the second region is a hardened protect film of the QD inspection pad.

2. The display device according to claim 1, wherein the display panel further has a second substrate arranged to be opposed to the first substrate, and the portion of the first substrate other than the display portion is uncovered by the second substrate.

3. The display device according to claim 2, further comprising wirings in the second region.

4. The display device according to claim 2, wherein the display panel further has a liquid crystal layer between the first substrate and the second substrate.

5. The display device according to claim 4, further comprising an upper polarizing plate and a lower polarizing plate arranged on surfaces of the display panel.

6. The display device according to claim 5, further comprising a backlight unit arranged on a lower polarizing plate side of the display panel.

7. A display device comprising:

a first substrate;

a second substrate arranged to be opposed to the first substrate; and a liquid crystal layer arranged and sealed between the first substrate and the second substrate, wherein the first substrate includes a driving circuit fixed to the first substrate in a portion other than a display portion with an anisotropic conductive film and a flexible wiring board fixed to the first substrate at an end of the portion other than the display portion with the anisotropic conductive film, the portion other than the display portion of the first substrate has a first region where the driving circuit and the flexible wiring board are disposed, and a second region where a QD inspection pad is formed, the anisotropic conductive film is formed on a whole area of the first substrate except for the display portion, the anisotropic conductive film is also formed and hardened in the second region, the anisotropic conductive film is formed on the first region and the second region integrally, and the anisotropic conductive film which is formed on the second region is a hardened protect film of the QD inspection pad.

8. The display device according to claim 7, wherein the portion other than the display portion of the first substrate is uncovered by the second substrate.

9. The display device according to claim 8, further comprising wirings in the second region.

10. The display device according to claim 7, further comprising an upper polarizing plate and a lower polarizing plate arranged on surfaces of the display panel.

11. The display device according to claim 10, further comprising a backlight unit arranged on a lower polarizing plate side of the display panel.

* * * * *

UNITED STATES PATENT AND TRADEMARK OFFICE
CERTIFICATE OF CORRECTION

PATENT NO. : 9,477,123 B2
APPLICATION NO. : 14/070413
DATED : October 25, 2016
INVENTOR(S) : Kouichi Inoue et al.

It is certified that error appears in the above-identified patent and that said Letters Patent is hereby corrected as shown below:

In the Specification

Column 1, Line 7, change "tiled" to --filed--;
Column 1, Line 28, change "as driving circuit" to --as a driving circuit--;
Column 1, Line 32, change "uncovered, by" to --uncovered by--;
Column 1, Line 51, change "In conventional" to --In the conventional--;
Column 1, Line 52, change "film" to --films--;
Column 1, Line 63, change "conditions, of use" to --conditions of use--;
Column 2, Line 4, change "circuit," to --circuit--;
Column 2, Line 42, change "film applying" to --film, applying--;
Column 2, Line 64, change "device, of the" to --device of the--;
Column 3, Line 8, change "IC" to --1C--;
Column 3, Line 14, change "View" to --view--;
Column 3, Line 15, change "conventional, liquid" to --conventional liquid--;
Column 3, Line 40, change "conventional crystal" to --conventional liquid crystal--;
Column 4, Line 11, change "4B is pressed" to --4B, is pressed--;
Column 4, Line 44, change "(LCD) the" to --(LCD), the--;
Column 5, Line 29, change "(SUB2)" to --(SUB1)--;
Column 5, Line 52, change "(FPC) electrically" to --(FPC) is electrically--;
Column 5, Line 62, change "(FPC) fixed" to --(FPC) is fixed--;
Column 5, Line 64, change "1C the anisotropic" to --1C, the anisotropic--;
Column 5, Line 66, change "the ground head" to --the grooved head--;
Column 6, Line 8, change "haying" to --having--;
Column 6, Line 22, change "description the embodiment" to --description, the embodiment--;
Column 6, Line 23, change "a crystal display" to --a liquid crystal display--; and
Column 6, Line 25, change "invention be" to --invention can be--.

Signed and Sealed this
Twentieth Day of June, 2017

Joseph Matal
*Performing the Functions and Duties of the
Under Secretary of Commerce for Intellectual Property and
Director of the United States Patent and Trademark Office*